US012799597B2

(12) United States Patent
Maskrot et al.

(10) Patent No.: US 12,799,597 B2
(45) Date of Patent: Nov. 17, 2026

(54) DEVICE FOR DIFFUSING A PRECURSOR WITH A CONTAINER HAVING AT LEAST ONE POROUS ELEMENT ALLOWING THE GENERATION OF AN AEROSOL TOWARDS A GROWTH SURFACE

(71) Applicant: COMMISSARIAT A L'ENERGIE ATOMIQUE ET AUX ENERGIES ALTERNATIVES, Paris (FR)

(72) Inventors: Hicham Maskrot, Monthléry (FR); Alexandre Michau, Bures-sur-Yvette (FR); Olivier Hercher, Fontenay-les-Briis (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 801 days.

(21) Appl. No.: 18/126,003

(22) Filed: Mar. 24, 2023

(65) Prior Publication Data

US 2023/0332289 A1 Oct. 19, 2023

(30) Foreign Application Priority Data

Mar. 24, 2022 (FR) ..................................... 22/02614

(51) Int. Cl.
*C23C 16/455* (2006.01)
*B33Y 10/00* (2015.01)
(Continued)

(52) U.S. Cl.
CPC ........ *C23C 16/45559* (2013.01); *B33Y 10/00* (2014.12); *B33Y 80/00* (2014.12);
(Continued)

(58) Field of Classification Search
None
See application file for complete search history.

(56) References Cited

U.S. PATENT DOCUMENTS 4,582,676 A 4/1986 Chubb
5,137,683 A 8/1992 Hertz et al.
(Continued)

FOREIGN PATENT DOCUMENTS

CN 113 265 642 A 8/2021
WO 2021/209746 A1 10/2021

OTHER PUBLICATIONS

Edsinger et al., "LWR Pellet-Cladding Interactions: Materials Solutions to SCC," JOM, Jul. 2001, pp. 9-13.
(Continued)

*Primary Examiner* — Jethro M. Pence
(74) *Attorney, Agent, or Firm* — Oliff PLC

(57) ABSTRACT

A precursor diffusion device configured to diffuse a growth precursor towards an external growth surface included on an external growth member, the diffusion device including a container including at least one porous element having a porosity configured to allow or prevent the passage of a precursor fluid through a thickness of the porous element, the porous element being configured so that the precursor fluid which passes through the thickness of the porous element generates an aerosol by fragmentation of the precursor fluid, the aerosol being formed of droplets of the precursor fluid. Also, a method for depositing a layer on a growth surface by such a diffusion device.

17 Claims, 3 Drawing Sheets

(51) Int. Cl.
*B33Y 80/00* (2015.01)
*C23C 16/04* (2006.01)
*C23C 16/448* (2006.01)

(52) U.S. Cl.
CPC ........ *C23C 16/045* (2013.01); *C23C 16/4486* (2013.01); *C23C 16/45568* (2013.01); *C23C 16/45578* (2013.01)

(56) References Cited

U.S. PATENT DOCUMENTS

| | | | | |
|---|---|---|---|---|
| 5,383,228 | A | 1/1995 | Armijo et al. | |
| 5,835,678 | A * | 11/1998 | Li | C23C 16/4486 392/394 |
| 6,542,566 | B2 | 4/2003 | Adamson et al. | |
| 8,128,753 | B2 * | 3/2012 | Bulovic | H10K 71/40 118/308 |
| 8,739,728 | B2 * | 6/2014 | Rebstock | B05C 1/10 118/200 |
| 9,096,923 | B2 * | 8/2015 | Clinton | C23C 18/125 |
| 10,850,302 | B2 * | 12/2020 | Ito | B05D 1/26 |
| 12,042,768 | B2 * | 7/2024 | Flint | B01D 67/0046 |
| 2012/0255488 | A1 * | 10/2012 | Rebstock | H10F 71/125 118/200 |

OTHER PUBLICATIONS

Cox, B., "Pellet-Clad Interaction (PCI) Failures of Zirconium Alloy Fuel Cladding—a Review," Journal of Nuclear Materials, 1990, vol. 172, pp. 249-292.
Junkrans et al., "ASEA-Atom Results on PCI Experiments on Fuel Rods; a Review," Journal of Nuclear Materials, 1979, vol. 87, pp. 247-520.
Paustian et al., "An In-Core Large Scale Demonstration of Barrier Fuel at Quad Cities 2," Session II: Alternative Fuel Designs and Operational Strategies to Improve PCI, International Atomic Energy Agency (IAEA), 1984, pp. 56-60.
Nuclear Energy Agency Organisation for Economic Co-Operation and Development, "Very High Burn-ups in Light Water Reactors," Organisation for Economic Co-Operation and Development—Nuclear Energy Agency, 2006.
Weidinger, Hans G., "Zr-Alloys, the Nuclear Material for Water Reactor Fuel. A Survey and Update with Focus on Fuel for Pressurized Water Reactor Systems," 7th International Conference on WWER Fuel Performance, Modelling and Experimental Support, Sep. 17-21, 2007, pp. 1-40.
Olander et al., "Chemical processes in defective LWR fuel rods," Journal of Nuclear Materials, 1997, vol. 248, pp. 214-219.
Hoffmann et al., "Power transient tests of high burnup Fe-enhanced Zr liner rodlets," Proceedings of the Water Reactor Fuel Performance Meeting—WRFPM / Top Fuel, 2009.
Van De Velde et al., "Efficiency Improvement of Nuclear Power Plant Operation: The Significant Role of Advanced Nuclear Fuel Technologies," International Youth Nuclear Congress 2000: Youth, Future, Nuclear: Proceedings and Multimedia Presentation, 2000.
Rudling, Peter, "Secondary Degradation Mechanisms—a Theoretical Approach to Remedical Actions," 2001, Ski Project No. 99133.
Jha et al., "Co-extrusion of Zircaloy-2 and Zr—Sn alloy for double clad tube manufacturing: Numerical simulation and experimental validation," Journal of Manufacturing Processes, 2019, vol. 39, pp. 18-25.
Murty, K. Linga, "Creep Studies for Zircaloy Life Prediction in Water Reactors," JOM, Oct. 1999, pp. 32-39.
Urban et al., "Advanced Fuel Assemblies for Economic and Flexible Operation of Light Water Reactors," International Conference on Nuclear Engineering, 2001.
Klinger et al., "Experience and Reliability of Framatome ANP's PWR and BWR Fuel," Fuel Failure in Water Reactors: Causes and Mitigation—Proceedings of a Technical Meeting, 2003.
Wood et al., "Improved CANDU Fuel Performance: a summary of previous AECL publications," International Atomic Energy Agency (IAEA), 1980, pp. 79-83.
Pankaskie, P. J., "The Impact of Pellet-Cladding Interaction on Fuel Integrity—a Status Report," Battelle Pacific Northwest Laboratories, Feb. 1978, pp. 1-28.
Abdelrazek et al., "Pyrolytic Carbon Coating of Zircaloy-4 Clads at Relatively Low Temperatures," Conference proceedings of the 4. International Conference on CANDU Fuel, 1995.
Peddicord et al., "Current Trends in Fuel Development and Future Needs in Extended Burnup," Nuclear Engineering and Design, 1987, vol. 101, pp. 199-206.
Lo et al., "Vanadium diffusion coating on HT-9 cladding for mitigating the fuel cladding chemical interactions," Journal of Nuclear Materials, 2014, vol. 451, pp. 137-142.
Lee et al., "Effect of Zr Thin Film on Zr Foil as a FCCI Barrier Between Lanthanide (La—Ce) and Clad Material," Met. Mater. Int., 2015, vol. 21, No. 3, pp. 498-503.
Kim et al., "Effect of CrN barrier on fuel-clad chemical interaction," Nuclear Engineering and Technology, 2018, vol. 50, pp. 724-730.
Nov. 10, 2022 Search Report issued in French Patent Application No. 2202614.
Nov. 10, 2022 Written Opinion issued in French Patent Application No. 2202614.

* cited by examiner

DEVICE FOR DIFFUSING A PRECURSOR WITH A CONTAINER HAVING AT LEAST ONE POROUS ELEMENT ALLOWING THE GENERATION OF AN AEROSOL TOWARDS A GROWTH SURFACE

TECHNICAL FIELD OF THE INVENTION

The present invention concerns a precursor diffusion device configured to diffuse a growth precursor towards an external growth surface comprised on an external growth member.

The invention also concerns a method for depositing a layer on a growth surface, the deposition method comprising a step of providing such a diffusion device, wherein the at least one receiving enclosure is at least partially filled with a precursor fluid.

STATE OF THE ART

The increase in the share of renewable energies in the global energy mix contributes to increasing the intermittent nature of the electrical energy supply. Thus, it is necessary to couple these intermittent energy sources with stable and flexible third-party energy sources, in order to compensate for their intermittent nature. In the case where said third-party energy source is a nuclear power source, the compensation gives rise to an increase in the number of power transient phases, which will then become more frequent for the nuclear power plants.

Such an increase in the power transient phases has a direct effect on some components such as the fuel pellets and the clads in which they are accommodated. It is indeed necessary to find a solution to limit the problem called the PCI (pellet clad interaction).

During an incident or accident resulting in a (generalized or local) increase in power, the PCI corresponds to the tensioning of the fuel rod clad under the effect of the interaction with the fuel pellet, which expands more strongly than the clad. When the interaction between the pellet and the clad is essentially mechanical, this is referred to as PCmI. The PCmI is subsequent to a power pulse, i.e. a rapid rise in power, not followed by a power maintenance level. It is therefore appropriate, for these situations and for medium or high burn rates, to limit the deformation of the fuel clad in order to prevent clad failure, which can lead to fuel dispersion in the primary circuit, in particular in case of reactivity insertion transients.

Incidents characterized by a power ramp followed by a power maintenance have a risk of clad failure called PCI I-SCC. This is an iodine-induced stress corrosion cracking, which leads to a perforation without risk of fuel dispersion.

It is known from the state of the art to propose a clad having an internal layer allowing limiting or even eliminating the effects of the PCI. However, the most mature method for depositing such an internal layer leads to large heterogeneities in thickness over centimetric or even metric lengths.

OBJECT OF THE INVENTION

The aim of the present invention is to propose a solution which addresses all or part of the aforementioned problems.

This aim can be achieved thanks to the implementation of a precursor diffusion device configured to diffuse a growth precursor towards an external growth surface comprised on an external growth member, said diffusion device comprising a container internally delimiting at least one receiving enclosure, the container being at least partially constituted by at least one porous element, said porous element internally delimiting an inner surface, said inner surface at least partially delimiting the at least one receiving enclosure, said porous element externally delimiting a diffusion surface intended to face towards the external growth surface.

Said at least one receiving enclosure being configured to contain a precursor fluid comprising said growth precursor.

The diffusion device comprising the precursor fluid contained in the receiving enclosure.

Said porous element having a porosity configured on the one hand to allow said precursor fluid to pass through a thickness of the porous element counted between said inner surface and said diffusion surface as long as a pressure of the precursor fluid contained in the receiving enclosure is strictly higher than a threshold pressure, on the other hand to prevent the precursor fluid from passing through said thickness of the porous element when the pressure of the precursor fluid contained in the receiving enclosure is lower than said threshold pressure, said threshold pressure being strictly higher than an external pressure prevailing outside the container.

The porous element being configured so that the precursor fluid which passes through the thickness of the porous element generates, from the diffusion surface, an aerosol by fragmentation of the precursor fluid.

Said aerosol being formed of droplets of the precursor fluid and contained between the diffusion surface and the external growth surface.

The previously described arrangements allow proposing a diffusion device adapted to generate an aerosol comprising droplets of a precursor fluid at a growth surface. Advantageously, the previously described diffusion device allows controlling both the type of precursor fluid comprised in the diffused aerosol, and the quantity of diffused aerosol. Furthermore, it is possible to locally diffuse said aerosol close to the growth surface. Thus, any losses of precursor fluid are limited. Finally, the diffusion device allows homogeneously diffusing the precursor fluid in the form of an ultra-divided or gaseous liquid over the entire growth surface, avoiding inhomogeneities. The fragmentation of the precursor fluid allows improving its evaporation and its reactivity, in particular when used in a chemical vapor deposition method in a chemical growth furnace.

The diffusion device may also have one or more of the following features, taken alone or in combination.

According to one embodiment, the porous element comprises a metallic material. For example, the porous element consists in a metallic material.

According to one embodiment, the metallic material of the porous element is steel.

According to one embodiment, the metallic material of the porous element is based on Nickel, Aluminum or Tungsten.

According to one embodiment, the porous element is adapted to withstand pressures and temperatures used in a chemical vapor deposition process. For example, the porous element is configured to remain intact at temperatures comprises between 1000° C. and 1500° C.

Thus, the diffusion device is suitable for use in a chemical vapor deposition process.

According to one embodiment, the diffusion device is configured to supply an aerosol comprising at least one precursor agent at the growth surface in a manner allowing the growth of a layer on the growth surface. For example, said layer can be a protective layer. Advantageously, the diffusion device allows controlling the thickness of the protective layer deposited on the growth surface.

According to one embodiment, the precursor fluid is liquid, for example, the precursor fluid may comprise a solid precursor agent dissolved in a solvent. Alternatively, the precursor fluid may comprise a mixture of a solvent and a liquid precursor agent.

According to one embodiment, the precursor agent comprises chromium oxide $Cr_2O_3$.

According to one embodiment, the container is entirely formed by the porous element.

According to one embodiment, the porous element is a porous filtration medium obtained by a method carried out in accordance with one of the embodiments described in document FR20/14263, the contents of which is incorporated by reference within the limits permitted by law.

According to one embodiment, the porous element comprises pores having an average diameter comprises between 2 μm and 100 μm.

According to one embodiment, the threshold pressure is between 2.105 Pa and 20.105 Pa.

According to one embodiment, the diffusion device comprises at least one pressurizing member configured to vary the pressure of the precursor fluid inside the receiving enclosure, so as to place the precursor fluid at a pressure higher than the threshold pressure, to allow the precursor fluid to pass through the porous element, from the inner surface towards the diffusion surface.

According to one embodiment, the pressurizing member comprises a pneumatic pump.

According to one embodiment, the container extends generally along a longitudinal axis and comprises a sealed end and a fluid inlet end spaced apart from each other along the longitudinal axis, the porous element being located between these two ends and the receiving enclosure being configured to receive the precursor fluid at the fluid inlet end and to be closed at the sealed end.

According to one embodiment, the at least one pressurizing member is disposed at the fluid inlet end of the porous element.

According to one embodiment, the diffusion surface of the porous element has a first prismatic shape characterized by a first basic profile, said first prismatic shape being generated by the rectilinear translation of said first basic profile along the longitudinal axis, and wherein the inner surface of the porous element has a second prismatic shape characterized by a second basic profile, said second prismatic shape being generated by the rectilinear translation of said second basic profile along the longitudinal axis.

According to one embodiment, at least one surface selected from the diffusion surface and the inner surface of the porous element is in the form of all or part of a cylindrical surface.

By "cylindrical surface" it should be mathematically understood a three-dimensional surface generated by a generating line which moves in a given direction based on a closed curved line called the directrix. In the present case, the directrix corresponds to the profile of the cross-section of the container at the porous element while the generating line is oriented parallel to the longitudinal axis.

According to one embodiment, the diffusion surface is tubular.

According to one embodiment, the inner surface is tubular.

According to one embodiment, the cross-section of the container is circular.

According to one embodiment, the first basic profile is a circle having a first radius, and wherein the second basic profile is a circle having a second radius strictly smaller than the first radius, the thickness of the porous element being equal to a difference between the first radius and the second radius.

According to one embodiment, the porous element has a length, counted longitudinally along the longitudinal axis, said length being strictly greater than 80 cm, and in particular strictly greater than 2 m.

According to one embodiment, the diffusion device comprises:

- a first receiving enclosure delimited by a first inner surface, and configured to receive a first precursor fluid; and
- a second receiving enclosure delimited by a second inner surface and configured to receive a second precursor fluid.

It is clearly understood that the use of the terms "first" and "second" is not restrictive and that according to the embodiment, there may be at least one additional receiving enclosure of the same nature as the first and second receiving enclosures and for which the same principles apply. In other words, the container can delimit at least three separate receiving enclosures, that may possibly contain respectively precursor fluids that are identical or different from one enclosure to another.

According to one embodiment, the first precursor fluid is different from the second precursor fluid.

In this way, it is possible to generate two different types of aerosols via a single diffusion device. For example, this allows locally diffusing, two different types of precursors, at the growth surface.

According to one embodiment, the first precursor fluid and the second precursor fluid are identical.

According to one embodiment, a first thickness counted between the first inner surface and the diffusion surface of the porous element, is strictly greater than a second thickness counted between the second inner surface and the diffusion surface of the porous element.

In this way, it is possible to adapt the thickness through which the precursor fluid passes according to the receiving enclosure which contains it and/or the nature of this precursor fluid. Thus, the generated aerosol or the diameter of the droplets constituting it may be different.

According to one embodiment, the diffusion device comprises a pressurizing member associated with each receiving enclosure. Thus, it is possible to adapt the pressure at which the first precursor fluid is placed and the pressure at which the second precursor fluid is placed according to the nature of the precursor fluid used.

According to one embodiment, the second precursor fluid comprises a coolant configured to cool the porous element.

According to one embodiment, the diffusion device comprises an assembly member disposed at an assembly end of the diffusion device, said assembly member being configured to allow the fastening, at said assembly end, of an external element selected from: another diffusion device and the growth member.

The previously described arrangements allow assembling several diffusion devices to each other, in order to match the shape of the growth surface.

According to one embodiment, the assembly end is disposed at the fluid inlet end of the container, seen along the longitudinal axis.

According to one embodiment, the porous element is obtained by three-dimensional printing (commonly called 3D printing).

Advantageously, the manufacture of the porous element by 3D printing allows both simply defining the shape of the porous element even if this shape is complex, and also reducing the manufacturing costs.

Furthermore, it is possible to obtain a specific shape of the porous element, for example a shape integrating a plurality of receiving enclosures allowing storing different precursor fluids before the implementation of a pressurization step.

Furthermore, 3D printing allows simply providing at least one assembly member at the assembly end of the diffusion device.

According to one embodiment, the porous element is obtained by a powder melting method.

According to one embodiment, the container is shaped so that it can be inserted into a tubular clad.

According to one embodiment, the growth member comprises the tubular clad.

According to one embodiment, the growth member comprises at least one flange configured to cooperate with the diffusion device, for example at the assembly end of the diffusion device.

The aim of the invention can also be achieved thanks to the implementation of a deposition method for depositing a layer on a growth surface, the deposition method comprising:

- a providing step in which a diffusion device as previously described is provided, the at least one receiving enclosure being at least partially filled with a precursor fluid;
- a step of delivering a growth member comprising a growth surface;
- a positioning step, in which the growth surface is disposed opposite the diffusion surface of the diffusion device;
- a step of pressurizing the receiving enclosure of the diffusion device, in which the precursor fluid is placed at a pressure higher than the threshold pressure, so as to allow said precursor fluid to pass through the thickness of the porous element, in order to generate an aerosol by fragmentation of the precursor fluid when the precursor fluid passes through the thickness of the porous element, said aerosol then being formed of droplets of the precursor fluid, and directed towards the growth surface;
- a growth step in which the aerosol undergoes a chemical reaction at the growth surface to form said layer.

The previously described arrangements allow proposing a deposition method in which an aerosol comprising droplets of a precursor fluid is locally injected at a growth surface. In this way, it is possible to control both the type of diffused aerosol, and the quantity of diffused aerosol. Thus, any losses of precursor fluid are limited.

The deposition method may also have one or more of the following features, taken alone or in combination.

According to one embodiment, the positioning step is implemented before the pressurizing step.

In this way, it is possible to position the external surface of the porous element opposite the growth surface to ensure a localized aerosol generation close to the growth surface, homogeneously over the entire growth surface.

According to one embodiment, the diffusion device is provided with at least one pressurizing member configured to implement the pressurizing step.

According to one embodiment, said at least one pressurizing member is configured to inject a pressurizing gas into the receiving enclosure.

According to one embodiment, at least one step selected from the positioning step, the pressurizing step and the growth step, is implemented in a growth chamber of a chemical growth furnace, preferably a chemical vapor deposition furnace.

In this way, the pressurizing step allows locally supplying a precursor agent contained in the precursor fluid at the growth surface to allow the growth of a layer in the chemical vapor deposition furnace during the growth step.

According to one embodiment, the growth step is implemented in the chemical growth furnace, so that the chemical growth furnace places the growth chamber at a growth temperature to heat the growth member and the diffusion device at said growth temperature to promote the chemical reaction of the aerosol at the growth surface.

According to one embodiment, the growth temperature is comprised between 1000° C. and 1500° C.

According to one embodiment, during the growth step, the chemical growth furnace places the growth chamber at a growth pressure so as to generate a growth vacuum allowing the growth of the layer on the growth surface.

According to one embodiment, the growth pressure is lower than 10-6 Pa.

According to one embodiment, the growth chamber is placed in an inert atmosphere during the growth step, said inert atmosphere being obtained by the injection of an inert gas, for example argon or nitrogen.

According to one embodiment, the pressurizing gas used during the pressurizing step is identical to the inert gas used to place the growth chamber in an inert atmosphere.

According to an embodiment in which the porous element comprises a first receiving enclosure and a second receiving enclosure, the second receiving enclosure can be configured to receive a coolant configured to cool the porous element during the growth step. Thus, it is possible to cool the porous element to avoid an undesirable deposition of the precursor fluid in pores of the porous element, which could lead to clogging of said pores of the porous element and/or to disruption of a homogeneous growth on the growth surface.

According to one embodiment, the step of providing a diffusion device comprises a step of manufacturing the porous element by three-dimensional printing.

Advantageously, the manufacture of the porous element by 3D printing allows both simply defining the shape of the porous element even in a complex shape, and also reducing the manufacturing costs.

Furthermore, it is possible to obtain a specific shape of the porous element, for example a shape integrating a plurality of receiving enclosures allowing storing different precursor fluids before the implementation of the pressurizing step.

Furthermore, 3D printing simply allows providing at least one assembly member at the assembly end of the diffusion device.

According to one embodiment, the porous element is obtained by a powder melting method.

According to one embodiment, the deposition method comprises a filling step in which the precursor fluid is introduced into the at least one receiving enclosure of the diffusion device.

According to one embodiment, the filling step is implemented before the pressurizing step.

According to one embodiment, the providing step comprises providing a diffusion device wherein the first basic profile is a circle having a first radius, and wherein the second basic profile is a circle having a second radius strictly smaller than the first radius, the thickness of the porous element being equal to a difference between the first radius and the second radius, and wherein the step of delivering a growth member comprises the delivery of a generally tubular growth member along a main axis, said growth member internally delimiting an outwardly open cavity at an insertion opening disposed at one end of the growth member considered along the main axis, said cavity delimiting at least said growth surface and being in the form of a third prismatic shape characterized by a third basic profile, said third prismatic shape being generated by the rectilinear translation of said third basic profile along the main axis, said third basic profile being a circle having a radius strictly greater than the first radius, the positioning step comprising a step of inserting the diffusion device inside the cavity of the growth member through the insertion opening along the main axis.

According to one embodiment, the main axis is parallel or coincident with the longitudinal axis.

According to one embodiment, a length of the porous element counted along the longitudinal axis of the container is strictly greater than a length of the growth member counted along the main axis, so that after the step of inserting the diffusion device inside the growth member, the entire growth surface faces at least one portion of the external surface of the porous element.

In this way, the aerosol generation is uniform over the entire length of the growth member and over the entire surface of the growth surface.

Finally, the object of the invention can also be achieved thanks to the implementation of a system comprising a diffusion device of the type of one of those described previously, and a growth organ.

BRIEF DESCRIPTION OF THE DRAWINGS

Other aspects, aims, advantages and features of the invention will better appear on reading the following detailed description of preferred embodiments thereof, given as a non-limiting example, and made with reference to the appended drawings in which.

DETAILED DESCRIPTION

Figure 1:
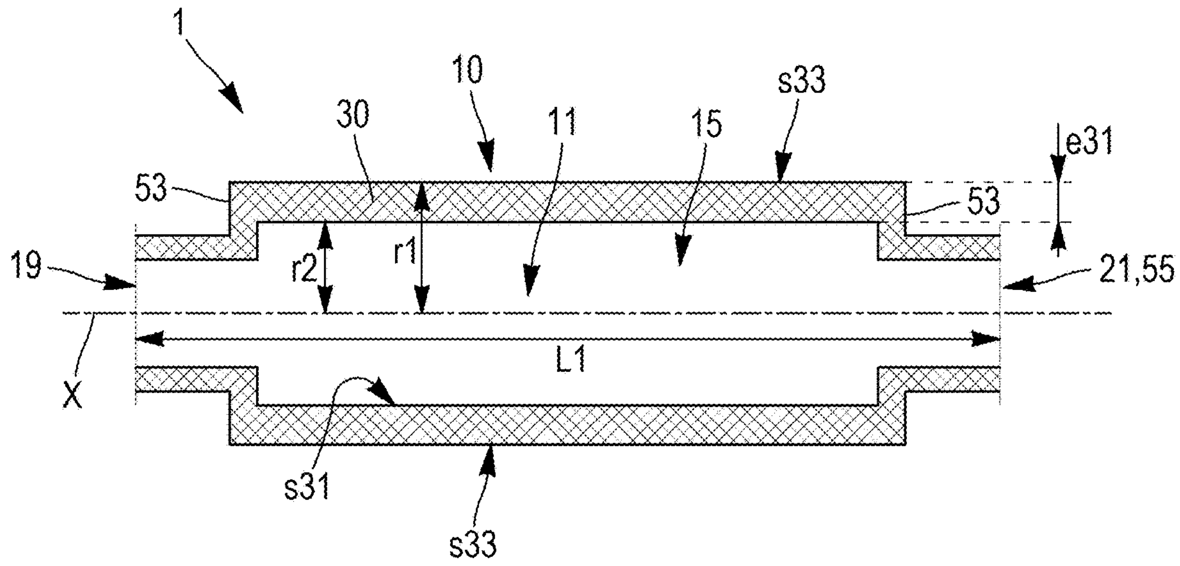
FIG. 1 is a schematic sectional view of a precursor diffusion device according to a first embodiment of the invention.

In the figures and in the following description, the same reference numerals represent identical or similar elements. In addition, the different elements are not represented to scale in order to promote clarity of the figures. Furthermore, the different embodiments and variants do not exclude each other and can be combined together.

As illustrated in FIGS. 1 to 6, the invention concerns a precursor diffusion device 1, configured to diffuse a growth precursor towards a growth surface s101. Said growth surface is included on an external growth member 100, which may for example comprise a tubular clad 101. Such a growth member 100 can advantageously be used to accommodate a fuel pellet. The invention also concerns a method for depositing a layer 103 on said growth surface s101. Advantageously, it can therefore be provided that such a deposition method is used to deposit a protective layer 103 on a clad accommodating a fuel pellet, in order to limit or even eliminate the effects of the PCI.

As will be described in more detail below with reference to the deposition method, the diffusion device 1 is suitable for use in a chemical vapor deposition process. Consequently, the diffusion device 1 is adapted to remain intact at temperatures comprised between 1000° C. and 1500° C., and/or at low pressures, typically less than 10-6 Pa.

Figure 2:
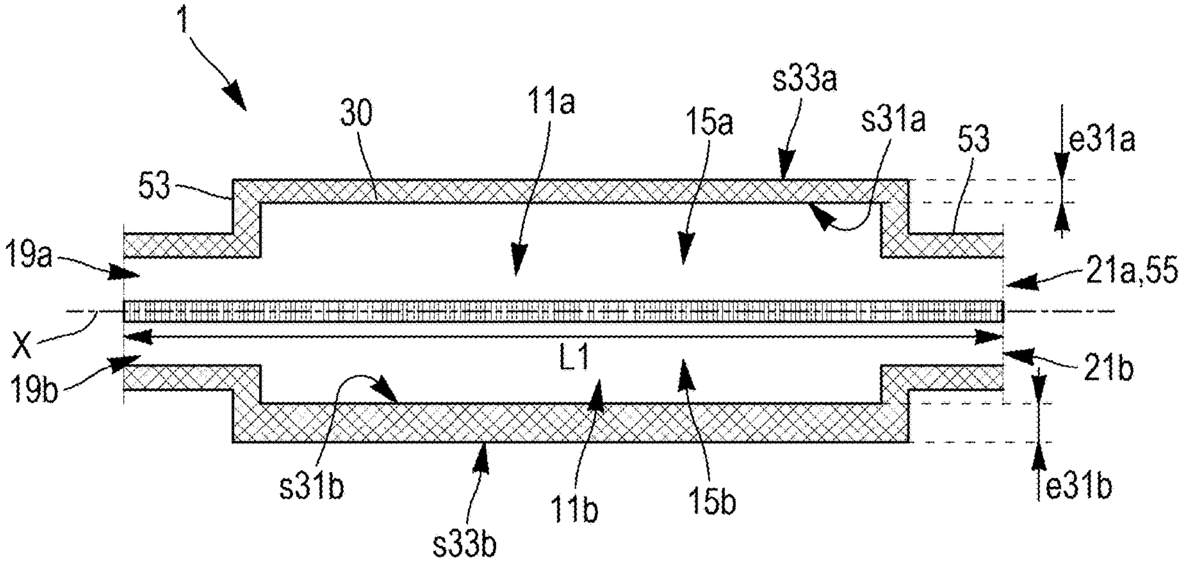
FIG. 2 is a schematic sectional view of a precursor diffusion device according to a second embodiment of the invention.

With reference to FIGS. 1 and 2, the diffusion device 1 comprises a container 10 internally delimiting at least one receiving enclosure 11. The container 10 is at least partially constituted by at least one porous element 30 which internally delimits an inner surface s31, and which externally delimits a diffusion surface s33 intended to face towards the external growth surface s101. The inner surface s31 then at least partially delimits the at least one receiving enclosure 11.

Advantageously, the porous element 30 consists essentially of or comprises a metallic material. The metallic material of the porous element 30 comprises at least one of the following materials in pure, alloy or oxide form: aluminum, stainless steel, nickel, or tungsten.

According to the non-limiting variants represented in FIGS. 1 and 2, the container 10 extends generally along a longitudinal axis X and comprises a sealed end 19 and a fluid inlet end 21 spaced apart from each other along the longitudinal axis X. The porous element 30 is located between these two ends and the receiving enclosure 11 can be closed at the sealed end 19. According to these variants, the container 10 is entirely formed by the porous element 30. The porous element 30 may for example have a length L1, counted longitudinally along the longitudinal axis X, which is strictly greater than 80 cm, and in particular strictly greater than 2 m. Furthermore, the diffusion surface s33 of the porous element 30 can have a first prismatic shape characterized by a first basic profile, said first prismatic shape being generated by the rectilinear translation of said first basic profile along the longitudinal axis X. The inner surface s31 of the porous element 30 has a second prismatic shape characterized by a second basic profile, said second prismatic shape being generated by the rectilinear translation of said second basic profile along the longitudinal axis X. More particularly, at least one surface selected from the diffusion surface s33 and the inner surface s31 of the porous element 30 is in the form of all or part of a cylindrical surface. FIG. 1 shows in particular a variant where the diffusion surface s33 and the inner surface s31 have the shape of a cylindrical surface. By "cylindrical surface" it should be mathematically understood a three-dimensional surface generated by a generating line which moves in a given direction based on a closed curved line called the directrix. In the present case, the directrix corresponds to the profile of the cross-section of the container 10 at the porous element 30 while the generating line is oriented parallel to the longitudinal axis X. According to the embodiments, the cross-section of the container 10 is circular, in order that the container 10 is shaped so that it can be inserted into a tubular clad 101. It is therefore clearly understood that according to the variant illustrated in FIG. 1, the diffusion surface s33 is tubular, and the inner surface s31 is tubular. In other words, the first basic profile is a circle having a first radius r1, the second basic profile is a circle having a second radius r2 strictly smaller than the first radius r1.

Said at least one receiving enclosure 11 of the diffusion device 1 is configured to contain a precursor fluid 15 comprising the growth precursor. In general, the receiving enclosure 11 is configured to receive the precursor fluid 15 at the fluid inlet end 21. The diffusion device 1 therefore comprises the precursor fluid 15 contained in the receiving enclosure 11. According to a first embodiment, the precursor fluid 15 is liquid, for example, the precursor fluid 15 may comprise a solid precursor agent dissolved in a solvent. Alternatively, the precursor fluid 15 may comprise a mixture of a solvent and a liquid precursor agent. According to one embodiment, the precursor agent comprises chromium oxide $Cr_2O_3$. In the non-limiting variant represented in FIG. 2, the diffusion device 1 comprises a first receiving enclosure 11*a* delimited by a first inner surface s31*a*, and configured to receive a first precursor fluid 15*a*, and a second receiving enclosure 11*b* delimited by a second inner surface s31*b* and configured to receive a second precursor fluid 15*b*. It is clearly understood that the use of the terms "first" and "second" is not restrictive and that according to the embodiment, there may be at least one additional receiving enclosure 11 of the same nature as the first and second receiving enclosures 11*a*, 11*b* and for which the same principles apply. In other words, the container 10 can delimit at least three separate receiving enclosures 11, that may possibly contain respectively precursor fluids 15 that are identical or different from one enclosure to another. Thus, the first precursor fluid 15*a* may be different from the second precursor fluid 15*b*. In this way, it is possible to generate two different types of aerosols via a single diffusion device 1. For example, this allows locally alternately or simultaneously diffusing, two different types of precursors, at the growth surface s101. For example, the second precursor fluid 15*b* may comprise a coolant configured to cool the porous element 30. Alternatively, it can be provided that the first precursor fluid 15*a* and the second precursor fluid 15*b* are identical.

The porous element 30 has a porosity configured on the one hand to allow said precursor fluid 15 to pass through a thickness e31 of the porous element 30 counted between said inner surface s31 and said diffusion surface s33 as long as a pressure of the precursor fluid 15 contained in the receiving enclosure 11 is strictly higher than a threshold pressure, and on the other hand to prevent the precursor fluid 15 from passing through said thickness e31 of the porous element 30 when the pressure of the precursor fluid 15 contained in the receiving enclosure 11 is lower than said threshold pressure. For example, the porous element 30 can comprise pores having an average diameter comprised between 2 μm and 100 μm. The threshold pressure is strictly higher than an external pressure prevailing outside the container 10. For example, the threshold pressure is between 2.105 Pa and 20.105 Pa. The porous element 30 is further configured so that the precursor fluid 15 which passes through the thickness e31 of the porous element 30 generates, from the diffusion surface s33, an aerosol 17 by fragmentation of the precursor fluid 15. Said aerosol 17 is formed of droplets of the precursor fluid 15 and is contained between the diffusion surface s33 and the external growth surface s101. According to the variant illustrated in FIG. 1, the thickness e31 of the porous element 30 is equal to a difference between the first radius r1 and the second radius r2. According to the variant illustrated in FIG. 2, a first thickness e31*a* is counted between the first inner surface s31*a* and the diffusion surface s33 of the porous element 30, and a second thickness e31*b* is counted between the second inner surface s31*b* and the diffusion surface s33 of the porous element 30. The first thickness e31*a* is strictly greater than the second thickness e31*b*. In this way, it is possible to adapt the thickness e31 through which the precursor fluid 15 passes according to the receiving enclosure 11*a*, 11*b* which contains it and/or the nature of this precursor fluid 15. Thus, the generated aerosol 17 or the diameter of the droplets constituting it may be different.

In general, the diffusion device 1 is configured to supply an aerosol 17 comprising at least one precursor agent at the growth surface s101 in a manner allowing the growth of a layer 103 on the growth surface s101. For example, said layer 103 may be a protective layer 103. Advantageously, the diffusion device 1 allows controlling the thickness of the protective layer 103 deposited on the growth surface s101.

Figure 3:
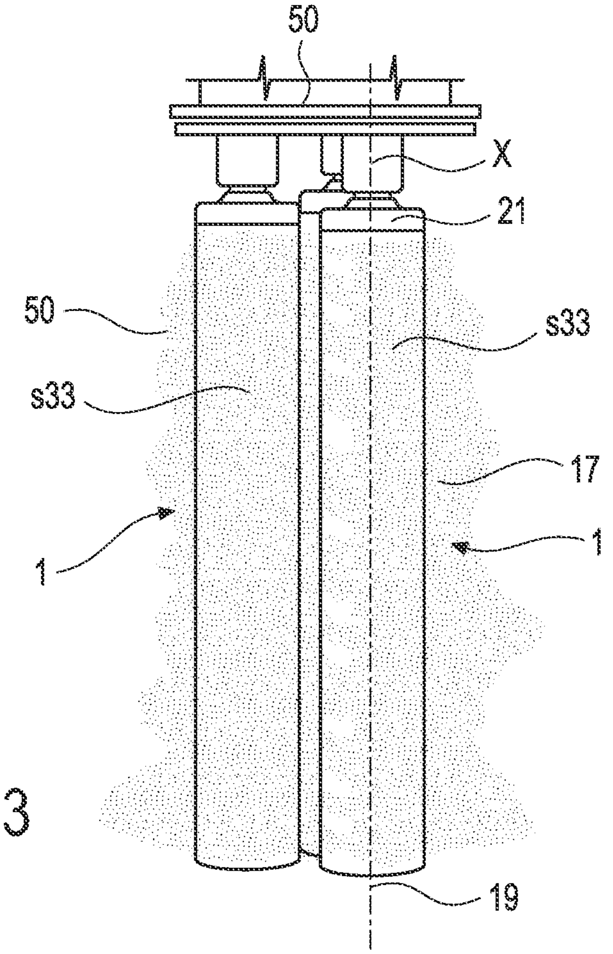
FIG. 3 is a schematic perspective view of two precursor diffusion devices according to one embodiment of the invention.

FIG. 3 illustrates the formation of said aerosol 17 by two distinct diffusion devices 1. As illustrated in FIG. 3, the diffusion device 1 may comprise at least one pressurizing member 50 configured to vary the pressure of the precursor fluid 15 inside the receiving enclosure 11, so as to place the precursor fluid 15 at a pressure higher than the threshold pressure, to allow the precursor fluid 15 to pass through the porous element 30, from the inner surface s31 towards the diffusion surface s33. For example, the pressurizing member 50 comprises a pneumatic pump. The at least one pressurizing member 50 can be disposed at the fluid inlet end 21 of the porous element 30. In the non-limiting case where the diffusion device 1 comprises two receiving enclosures 11*a*, 11*b*, it can be provided that the diffusion device 1 comprises a pressurizing member 50 associated with each receiving enclosure 11*a*, 11*b*. Thus, it is possible to adapt the pressure at which the first precursor fluid 15*a* is placed and the pressure at which the second precursor fluid 15*b* is placed according to the nature of the precursor fluid 15*a*, 15*b* used.

Figure 4:
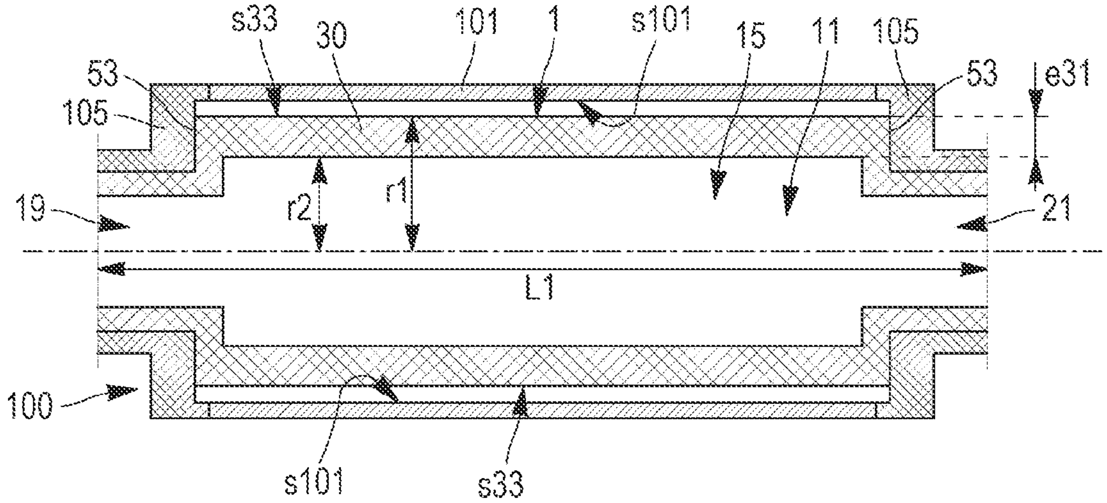
FIG. 4 is a schematic sectional view of a precursor diffusion device according to the embodiment of FIG. 1 and of a growth member.

Finally, and with particular reference to FIG. 4, the diffusion device 1 may comprise an assembly member 53 disposed at an assembly end 55 of the diffusion device 1. For example, the assembly end 55 is disposed at the fluid inlet end 21 of the container 10, seen along the longitudinal axis X. The assembly member 53 is configured to allow the fastening, at said assembly end 55, of an external element selected from: another diffusion device and the growth member 100. The previously described arrangements allow assembling several diffusion devices to each other, in order to match the shape of the growth surface s101. However, and as illustrated in FIG. 4, said assembly member 53 is configured to allow the fastening of the growth member 100. According to this variant, the diffusion device comprises two assembly members 53 made in one piece with the porous element. These assembly members 53 are in the form of annular shoulders disposed around the longitudinal axis X. In this case, it can be provided that the growth member 100 comprises at least one flange 105 configured to cooperate with the diffusion device 1, for example at the assembly end 55 of the diffusion device 1. FIG. 4 therefore illustrates a non-limiting variant in which two flanges 105 cooperate with the assembly members 53 of the diffusion device 1.

Advantageously, it can be provided that the porous element 30 is obtained by three-dimensional printing. Indeed, the manufacture of the porous element 30 by 3D printing allows both simply defining the shape of the porous element 30 even if this shape is complex, and also reducing the manufacturing costs. Furthermore, it is possible to obtain a specific shape of the porous element 30, for example a shape integrating a plurality of receiving enclosures 11*a*, 11*b* allowing storing different precursor fluids 15*a*, 15*b* before the implementation of a pressurizing step. In addition, 3D printing simply allows providing at least one assembly member 53 at the assembly end 55 of the diffusion device 1.

Alternatively, the porous element 30 can be obtained by a powder melting method.

The previously described arrangements allow proposing a diffusion device 1 adapted to generate an aerosol 17 comprising droplets of a precursor fluid 15 at a growth surface s101. Advantageously, the previously described diffusion device 1 allows controlling both the type of precursor fluid 15 comprised in the diffused aerosol 17, and the quantity of diffused aerosol 17. Furthermore, it is possible to locally diffuse said aerosol 17 close to the growth surface s101. Thus, any losses of precursor fluid 15 are limited. Finally, the diffusion device 1 allows homogeneously diffusing the precursor fluid 15 in the form of an ultra-divided or gaseous liquid over the entire growth surface s101, avoiding inhomogeneities. The fragmentation of the precursor fluid 15 allows improving its evaporation and its reactivity, in particular when used in a chemical vapor deposition method in a chemical growth furnace.

As indicated above, the invention also concerns a deposition method for depositing a layer 103 on a growth surface s101 of a growth member 100.

Figure 5:
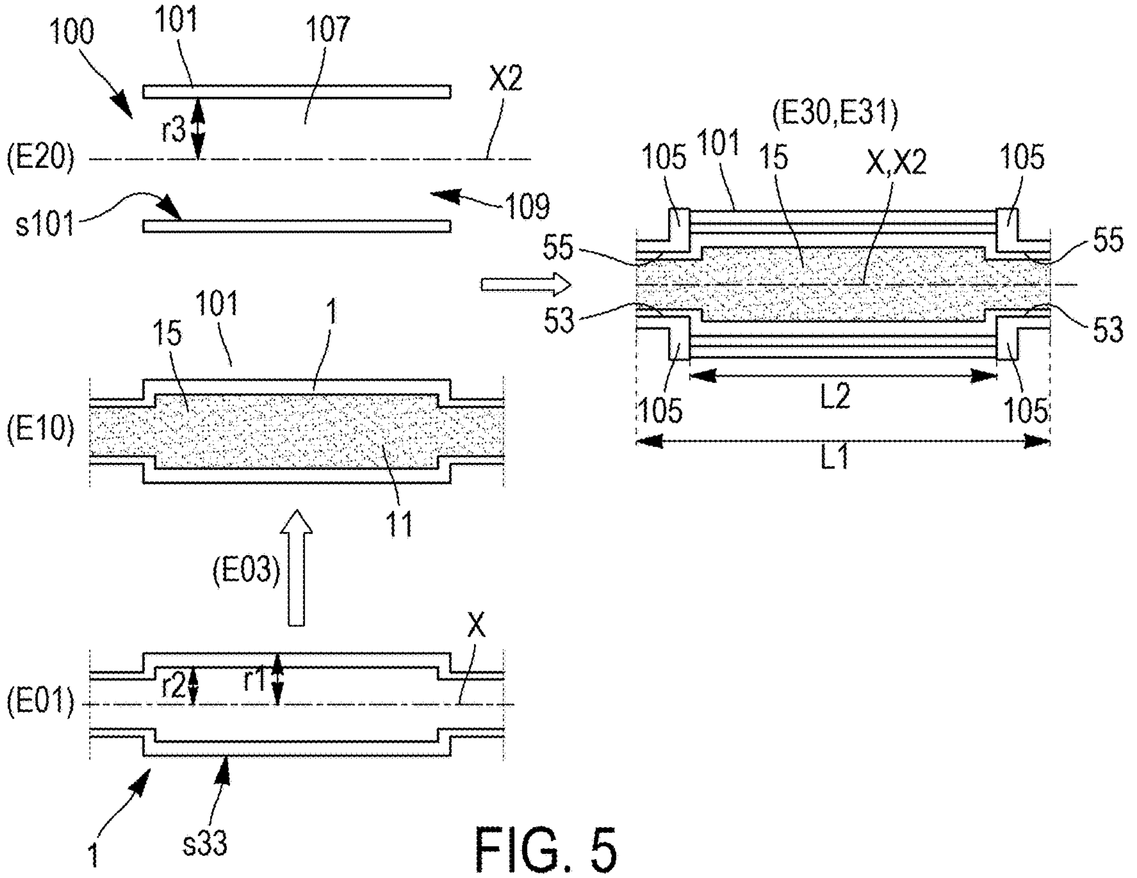
FIG. 5 is a schematic view of some steps of the deposition method according to a particular embodiment of the invention.
Figure 6:
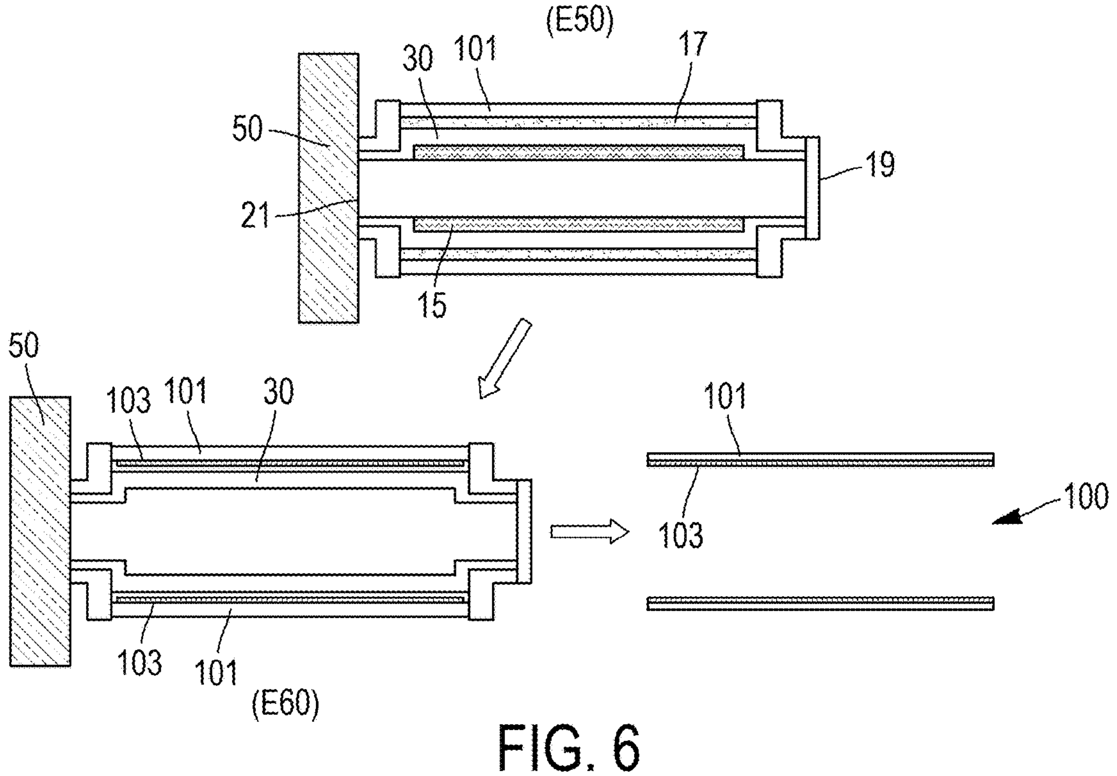
FIG. 6 is a schematic view of some steps of the deposition method according to a particular embodiment of the invention.

The deposition method illustrated for example in FIGS. 5 and 6 firstly comprises a providing step E10 in which a diffusion device 1 as previously described is provided. The step E10 of providing a diffusion device 1 may comprise a step E01 of manufacturing the porous element 30 by three-dimensional printing. Alternatively, the porous element 30 can be obtained by a powder melting method. Advantageously, the manufacture of the porous element 30 by 3D printing allows both simply defining the shape of the porous element 30 even in a complex shape, and also reducing the manufacturing costs. Furthermore, 3D printing simply allows providing at least one assembly member 53 at the assembly end 55 of the diffusion device 1 allowing the easier implementation of a positioning step E30 which will be described below. Finally, 3D printing allows obtaining a specific shape of the porous element 30, for example a shape integrating a plurality of receiving enclosures 11*a*, 11*b* allowing storing different precursor fluids 15*a*, 15*b* before the implementation of a pressurizing step E50 which will be described later.

Then, it can be provided that the deposition method comprises a filling step E03 in which the precursor fluid 15 is introduced into the at least one receiving enclosure 11 of the diffusion device 1. This filling step E03 is implemented before the pressurizing step E50. In this way, the at least one receiving enclosure 11 is at least partially filled with a precursor fluid 15 during the providing step E10.

The deposition method also comprises a step E20 of delivering a growth member 100 comprising a growth surface s101. According to the non-limiting variant illustrated in FIG. 5, the growth member 100 is generally tubular along a main axis X2, and internally delimits an outwardly open cavity 107 at an insertion opening 109 disposed at one end of the growth member 100 considered along the main axis X2. This cavity 107 at least partially delimits said growth surface s101.

Then, the deposition method comprises a positioning step E30, in which the growth surface s101 is disposed opposite the diffusion surface s33 of the diffusion device 1. As illustrated in FIG. 5, the providing step E10 may comprise providing a diffusion device 1 wherein the first basic profile is a circle having a first radius r1, and wherein the second basic profile is a circle having a second radius r2 strictly smaller than the first radius r1, the thickness e31 of the porous element 30 being equal to a difference between the first radius r1 and the second radius r2. The step E20 of delivering a growth member 100 may comprise the delivery of a growth member 100 in which the growth surface s101 having the form of a third prismatic shape characterized by a third basic profile, said third prismatic shape being generated by the rectilinear translation of said third basic profile along the main axis X2, said third basic profile being a circle having a radius r3 strictly greater than the first radius r1. Thus, the positioning step E30 may comprise a step E31 of inserting the diffusion device 1 inside the cavity 107 of the growth member 100 through the insertion opening 109 along the axis main X2. The main axis X2 is then parallel or coincident with the longitudinal axis X. Advantageously, it can be provided that a length L1 of the porous element 30 counted along the longitudinal axis X of the container 10 is strictly greater than a length L2 of the growth member 100 counted along the main axis X2, so that after the step E31 of inserting the diffusion device 1 inside the growth member 100, the entire growth surface s101 faces at least one portion of the external surface of the porous element 30. In this way, the aerosol 17 generation is uniform over the entire length L1 of the growth member 100 and over the entire surface of the growth surface s101.

The deposition method further comprises a step E50 of pressurizing the receiving enclosure 11 of the diffusion device 1 generally implemented after the positioning step E30. In this way, it is possible to position the external surface of the porous element 30 opposite the growth surface s101 to ensure a localized aerosol 17 generation close to the growth surface s101, homogeneously over the entire growth surface s101. During this pressurizing step E50, the precursor fluid 15 is placed at a pressure higher than the threshold pressure, so as to allow said precursor fluid 15 to pass through the thickness e31 of the porous element 30, in order to generate the aerosol 17 by fragmentation of the precursor fluid 15 when the precursor fluid 15 passes through the thickness e31 of the porous element 30, said aerosol 17 then being formed of droplets of the precursor fluid 15, and directed towards the growth surface s101. According to the embodiment represented in FIG. 6, the diffusion device 1 is provided with at least one pressurizing member 50 configured to implement the pressurizing step E50. For example, the pressurizing member 50 is configured to inject a pressurizing gas into the receiving enclosure 11.

Finally, the deposition method comprises a growth step E60 in which the aerosol 17 undergoes a chemical reaction at the growth surface s101 to form said layer 103. Therefore, the growth step E60 can be implemented in the chemical growth furnace, so that the chemical growth furnace places the growth chamber at a growth temperature to heat the growth member 100 and the diffusion device 1 at said growth temperature to promote the chemical reaction of the aerosol 17 at the growth surface s101. For example, the growth temperature is comprised between 1000° C. and 1500° C. Furthermore, during this growth step E60, the chemical growth furnace can place the growth chamber at a growth pressure so as to generate a growth vacuum allowing the growth of the layer 103 on the growth surface s101. For example, the growth pressure is lower than 10-6 Pa. Finally, the growth chamber can be placed in an inert atmosphere during the growth step E60, said inert atmosphere being obtained by the injection of an inert gas, for example argon or nitrogen. Advantageously, the pressurizing gas used during the pressurizing step E50 is identical to the inert gas used to place the growth chamber in an inert atmosphere.

In general, at least one step selected from the positioning step E30, the pressurizing step E50 and the growth step E60, is implemented in the growth chamber of the chemical growth furnace, preferably a chemical vapor deposition furnace. In this way, the pressurizing step E50 allows locally supplying a precursor agent contained in the precursor fluid 15 at the growth surface s101 to allow the growth of a layer 103 in the chemical vapor deposition furnace during the growth step E60.

In the case where the porous element 30 comprises a first receiving enclosure 11*a* and a second receiving enclosure 11*b*, the second receiving enclosure 11*b* can be configured to receive a coolant configured to cool the porous element 30 during the growth step E60. Thus, it is possible to cool the porous element 30 to avoid an undesirable deposition of the precursor fluid 15 in pores of the porous element 30, which could lead to clogging of said pores of the porous element 30 and/or to disruption of a homogeneous growth on the growth surface s101.

The previously described arrangements allow proposing a deposition method in which an aerosol 17 comprising droplets of a precursor fluid 15 is locally injected at Zo a growth surface s101. In this way, it is possible to control both the type of diffused aerosol 17, and the quantity of diffused aerosol 17. Thus, any losses of precursor fluid 15 are limited.

The invention claimed is:

1. A diffusion device of a precursor configured to diffuse a growth precursor towards an external growth surface comprised on an external growth member, the diffusion device comprising a container internally delimiting at least one receiving enclosure, the container being at least partially constituted by at least one porous element, the porous element internally delimiting an inner surface, the inner surface at least partially delimiting the at least one receiving enclosure, the porous element externally delimiting a diffusion surface intended to face towards the external growth surface, the at least one receiving enclosure being configured to contain a precursor fluid comprising the growth precursor, the diffusion device comprising the precursor fluid contained in the receiving enclosure, the porous element having a porosity configured on one hand to allow the precursor fluid to pass through a thickness of the porous element counted between the inner surface and the diffusion surface when a pressure of the precursor fluid contained in the receiving enclosure is higher than a threshold pressure, on another hand to prevent the precursor fluid from passing through the thickness of the porous element when the pressure of the precursor fluid contained in the receiving enclosure is lower than the threshold pressure, the threshold pressure being higher than an external pressure prevailing outside the container;

wherein the porous element comprises a metallic material comprising pores having an average diameter between 2 μm and 100 μm;

the porous element being configured so that the precursor fluid which passes through the thickness of the porous element generates, from the diffusion surface, an aerosol by fragmentation of the precursor fluid, the aerosol being formed of droplets of the precursor fluid and contained between the diffusion surface and the external growth surface.

2. The diffusion device according to claim 1, wherein the container is entirely formed by the porous element.

3. The diffusion device according to claim 1, comprising at least one pressurizing member configured to vary the pressure of the precursor fluid inside the receiving enclosure, so as to place the precursor fluid at a pressure higher than the threshold pressure, to allow the precursor fluid to pass through the porous element, from the inner surface towards the diffusion surface.

4. The diffusion device according to claim 1, wherein the container extends along a longitudinal axis and comprises a sealed end and a fluid inlet end spaced apart from each other along the longitudinal axis, the porous element being located between these two ends and the receiving enclosure being configured to receive the precursor fluid at the fluid inlet end and to be closed at the sealed end.

5. The diffusion device according to claim 4, wherein the porous element has a length, counted longitudinally along the longitudinal axis, the length being greater than 80 cm.

6. The diffusion device according to claim 1, comprising:

a first receiving enclosure delimited by a first inner surface, and configured to receive a first precursor fluid; and a second receiving enclosure delimited by a second inner surface and configured to receive a second precursor fluid.

7. The diffusion device according to claim 1, comprising an assembly member disposed at an assembly end of the diffusion device, the assembly member being configured to allow the fastening, at the assembly end, of an external element selected from: another diffusion device and the growth member.

8. The diffusion device according to claim 1, wherein the porous element is obtained by three-dimensional printing.

9. The diffusion device according to claim 1, wherein the container is shaped so that it can be inserted into a tubular clad.

10. A deposition method for depositing a layer on a growth surface, the deposition method comprising:

a providing step in which a diffusion device according to claim 1 is provided, the at least one receiving enclosure being at least partially filled with a precursor fluid;

a step of delivering a growth member comprising a growth surface;

a positioning step, in which the growth surface is disposed opposite the diffusion surface of the diffusion device;

a step of pressurizing the receiving enclosure of the diffusion device, in which the precursor fluid is placed at a pressure higher than the threshold pressure, so as to allow the precursor fluid to pass through the thickness of the porous element, so as to generate an aerosol by fragmentation of the precursor fluid when the precursor fluid passes through the thickness of the porous element, the aerosol then being formed of droplets of the precursor fluid, and directed towards the growth surface;

a growth step in which the aerosol undergoes a chemical reaction at the growth surface to form the layer.

11. The deposition method according to claim 10, wherein the positioning step is implemented before the pressurizing step.

12. The deposition method according to claim 10, wherein at least one step selected from the positioning step, the pressurizing step and the growth step, is implemented in a growth chamber of a chemical growth furnace.

13. The deposition method according to claim 12, wherein the growth step is implemented in the chemical growth furnace, so that the chemical growth furnace places the growth chamber at a growth temperature to heat the growth member and the diffusion device at the growth temperature to promote the chemical reaction of the aerosol at the growth surface.

14. The deposition method according to claim 10, wherein the step of providing a diffusion device comprises a step of manufacturing the porous element by three-dimensional printing.

15. The deposition method according to claim 10, comprising a filling step in which the precursor fluid is introduced into the at least one receiving enclosure of the diffusion device.

16. The deposition method according to claim 10, wherein the providing step comprises providing a diffusion device wherein the first basic profile is a circle having a first radius, and wherein the second basic profile is a circle having a second radius lower than the first radius, the thickness of the porous element being equal to a difference between the first radius and the second radius;

and wherein the step of delivering a growth member comprises the delivery of a tubular growth member along a main axis, the growth member internally delimiting an outwardly open cavity at an insertion opening disposed at one end of the growth member considered along the main axis, the cavity delimiting at least the growth surface and being in the form of a third prismatic shape characterized by a third basic profile, the third prismatic shape being generated by the rectilinear translation of the third basic profile along of the main axis, the third basic profile being a circle having a radius greater than the first radius, the positioning step comprising a step of inserting the diffusion device inside the cavity of the growth member through the insertion opening along the main axis.

17. The deposition method according to claim 16, wherein a length of the porous element counted along the longitudinal axis of the container is greater than a length of the growth member counted along the main axis, so that after the step of inserting the diffusion device inside the growth member, the entire growth surface faces at least one portion of the external surface of the porous element.

* * * * *